United States Patent

Ohmi et al.

Patent Number: 5,439,596
Date of Patent: Aug. 8, 1995

[54] METHOD OF PRODUCING PURE WATER, SYSTEM THEREFOR AND CLEANING METHOD THEREFOR

[75] Inventors: Tadahiro Ohmi, 1-17-301, Komegabukuro 2-chome, Aoba-ku, Miyagi-ku Sendai-shi, Japan; Isamu Sugiyama, Miyagi, Japan

[73] Assignee: Tadahiro Ohmi, Sendai, Japan

[21] Appl. No.: 167,981

[22] PCT Filed: Jul. 2, 1992

[86] PCT No.: PCT/JP92/00837
§ 371 Date: Dec. 23, 1993
§ 102(e) Date: Dec. 23, 1993

[87] PCT Pub. No.: WO93/01134
PCT Pub. Date: Jan. 21, 1993

[30] Foreign Application Priority Data
Jul. 2, 1991 [JP] Japan .................. 3-188145

[51] Int. Cl.$^6$ .................. C02F 1/30
[52] U.S. Cl. .................. 210/748; 134/2; 134/42; 250/436; 250/492.2; 422/21; 422/186
[58] Field of Search .................. 210/748; 422/186, 21; 134/2, 3, 42; 250/432 R, 435, 436, 492.1, 492.2

[56] References Cited

U.S. PATENT DOCUMENTS

| | | | |
|---|---|---|---|
| 4,013,552 | 3/1977 | Kreuter | 210/748 |
| 4,219,415 | 8/1980 | Nassef et al. | 210/184 |
| 4,345,983 | 8/1982 | Wan | 210/748 |
| 4,456,512 | 6/1984 | Bieler et al. | 210/748 |
| 4,582,629 | 4/1986 | Wolf | 252/348 |
| 5,068,030 | 11/1991 | Chen | 210/95 |
| 5,215,634 | 6/1993 | Wan et al. | 204/157.9 |

FOREIGN PATENT DOCUMENTS 61-46290  3/1986  Japan .
63-270590  11/1988  Japan .

Primary Examiner—Neil McCarthy
Attorney, Agent, or Firm—Baker & Daniels

[57] ABSTRACT

A method and apparatus for improving the wettability with pure water of the surface of a substrate, in particular, a silicon wafer from which the oxide film has been removed, whereby pure water is brought into contact with the surface of silicon, so that the impurities on the silicon can be completely cleaned away.

One feature resides in that microwaves are applied in a state where water is brought into contact with a catalyst. Furthermore, another feature resides in that a catalyst holding means, in which the catalyst is held so as to come in contact with water introduced to the interior thereof, and a microwave producing means for applying the microwaves to the water introduced into the catalyst holding means are provided in the intermediate portion of a piping for delivering the pure water to a use point.

9 Claims, 3 Drawing Sheets

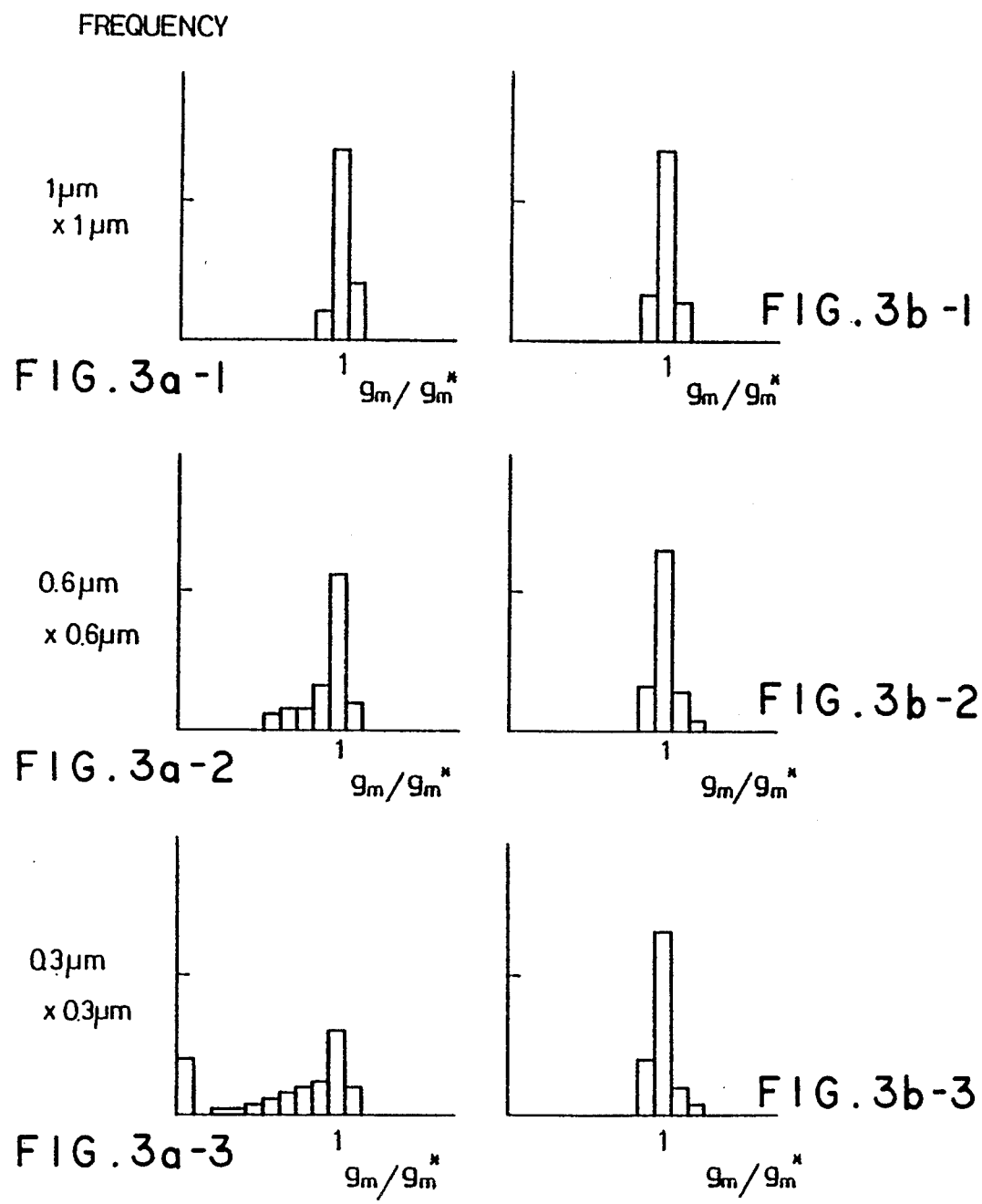

METHOD OF PRODUCING PURE WATER, SYSTEM THEREFOR AND CLEANING METHOD THEREFOR

TECHNICAL FIELD

The present invention relates to a method of producing pure water, a system therefor, and a cleaning method, and in particular, relates to a method of producing pure water, a system therefor, and a cleaning method which are preferably used in cleaning processes in LSI manufacturing processes.

BACKGROUND ART

The conventional technology will be explained using the cleaning process of an LSI process as an example.

In an LSI manufacturing process, an oxide film is formed on a silicon wafer, window-opening having a predetermined pattern is conducted in the oxide film, and then cleaning is conducted, and depending on the purpose, p-type or n-type chemical elements are introduced, and a procedure, in which the above impurities are diffused or annealed in the silicon, is repeatedly conducted in a thermal diffusion furnace, and elements are thus formed.

When conducting heat treatment such as thermal diffusion or annealing or the like, if even a small amount of impurities such as, for example, metals or the like, adhere to the silicon surface, then the characteristics of the element which is formed worsen; for example, a drop in the base collector withstand voltage, an increase in leak currents, or the like, is experienced.

Accordingly, in semiconductor manufacturing processes, cleaning processes are extremely important in order to manufacture high-performance elements, and it is necessary to completely remove the contaminants on the silicon.

However, after the removal of an oxide film, the silicon surface is hydrophobic, and the wettability thereof with water is normally poor, so that, in other words, it is difficult to bring the pure water and the contaminant impurities into contact, and it is difficult to completely clean away the very small amount of impurities adhering to the silicon surface. As a result, it is impossible to obtain elements having higher performance, as explained above, and this represents a great hindrance to the attainment of a shift to high performance elements.

The present invention has as an object thereof to provide a method of and system for producing pure water which is capable of completely cleaning away impurities on silicon by improving the wettability with pure water of a substrate body surface, and in particular, a silicon wafer substrate body from which an oxide film has been removed, and bringing pure water into contact with the silicon surface, and to provide a cleaning method.

DISCLOSURE OF THE INVENTION

A first gist of the present invention resides in a pure water production method, wherein microwaves are applied in the state in which water is brought into contact with a catalyst.

A second gist of the present invention resides in a pure water production apparatus, wherein a catalyst holding mechanism for holding a catalyst so as to come into contact with water introduced into the interior thereof, and a microwave producing mechanism for applying microwaves to the water introduced into the catalyst holding mechanism, are disposed in an intermediate portion of a piping for supplying pure water to a use point.

A third gist of the present invention resides in a substrate body cleaning method, wherein a substrate body is cleaned using pure water produced by means of the method described in gist 1 above.

(Embodiment Examples)

Hereinbelow, embodiment examples of the present invention will be explained.

The pure water of the present invention has a degree of purity suitable for use in cleaning procedures of semiconductor manufacturing processes. This pure water removes impurities as shown, for example, in Table 1; however, in cases of use in processes other than LSI manufacturing processes, other pure water may be used.

TABLE 1

| Specific Resistance | 18 MΩ · cm or more |
|---|---|
| TOC | $\leqq 1$ ppb |
| Silica | $\leqq 1$ ppb |
| Particles (0.07 μm) | $\leqq 1$/ml |
| Evaporation Residue | $\leqq 1$ ppb |

A structural example of the pure water production system of the present invention is shown in FIG. 1; an example of the production method will be explained using the Figure. Using city water as the source water, suspended matter dispersed in the water is removed by means of filtering apparatus 1, the water is then pressurized to a pressure of 15 kg/cm² by means of high pressure pump 2, and is supplied to reverse osmosis unit 3. The transmitted water, approximately 95% of the ions of which have been removed in reverse osmosis unit 3, is stored in transmitted water tank 4. Furthermore, concentrated water containing a high concentration of ions is discharged outside the system.

Next, the transmitted water is supplied to a first ion exchanging column 6-1 by pump 5; here, this water becomes pure water having a specific resistance of approximately 16–18MΩ.cm, and is stored in water storage tank 7. The pure water stored in water storage tank 7 is supplied to second ion-exchanging column 6-2 by circulation pump 8, and becomes pure water having a specific resistance of 18 MΩ.cm or more. This pure water is circulated along a path in which it passes through sterilization treatment mechanism 9, ultrafiltration apparatus 10, and use point 13, and is returned to pure water tank 7.

The sterilization mechanism 9 of the circulation path prevents the outbreak of bacteria in the pure water; examples thereof include an ozone pouring apparatus or an ultraviolet lamp or the like. Of course, other methods may be employed. Ultrafiltration apparatus 11 is provided in order to remove very small suspended matter or the remains of bacteria bodies by sterilization mechanism 9.

In the present invention, a catalyst holding mechanism 11 and microwave generation mechanism 12 are provided between the above circulation path and the use point 13, and microwaves are applied while causing the pure water to come into contact with the catalyst. Furthermore, in accordance with the flow rate which is used, it is acceptable to provide a pump at the upstream side of the catalyst holding mechanism. By applying microwaves while causing the pure water to make contact with the catalyst, the wettability of the pure water with respect to the silicon wafer changes, and pure water which did not wet the silicon wafer is altered so as to wet the entire surface of the wafer. The reason for this is unclear; however, it is inferred that by irradiating microwaves in the presence of a catalyst, the hydrogen bonds between water molecules are broken, and because the water molecules, which had existed as gigantic molecules, act as molecules having fewer units, it becomes possible to wet the silicon wafer.

Any appropriate apparatus may be employed as the catalyst holding mechanism 11 which is used in the present invention, insofar as it is permeable by microwaves and is capable of holding the catalyst; for example, as shown in FIG. 2, it may be structured so that Teflon sheet filters 18 possessing micropores on a level of 1–5 μm and having a thickness of approximately 1 mm are inserted into a Teflon (brand name of polyethylene fluoride fibers made by DuPont Corp.; hereinbelow identical) vessel 14, which has an inner diameter which is greater than that of pure water input port 15 and output port 16, and catalysts 17 are inserted between these Teflon filters to form catalyst layers. Pd, Pt, or the like may be used, for example, as the catalyst, and it is preferable, from the point of view of reactivity, that the particle diameter be within a range of 1–10 μm. Furthermore, it is desirable that the width of the catalyst be small in order to suppress induction heating by means of the microwaves; for example, a with of approximately 1 mm is preferable. Furthermore, the microwaves are introduced so as to be parallel to the Teflon sheets and catalyst layers described above (in other words, so as to be perpendicular to the flow direction of the pure water).

Any apparatus may be employed as the microwave generating mechanism of the present invention, insofar as it is capable of generating microwaves having a frequency of 1–10 GHz; a magnetron-type generator is preferable in order to efficiently break the hydrogen bonds of the water. The output thereof varies according to the amount of pure water used; however, a generator on the level of 1 KW may be employed.

In the above description, an example was given in which the installation position of the catalyst holding mechanism 11 and the microwave generating mechanism 12 was located between the circulation system and the use point; however, these mechanisms may also be provided in the circulation system. From the point of view of cleanability, it is preferable that they be installed in proximity to the use point, and that nothing be interposed between them and the use point.

(Function)

As explained above, by means of applying microwaves to the pure water in the presence of a catalyst, the wettability with pure water of the silicon is greatly improved, and the silicon surface and the pure water can be effectively brought into contact, so that it is possible to clean away the extremely small amount of impurities adhering to the silicon surface.

That is to say, the impurities adhering to the silicon surface are completely removed, and it thus becomes possible to achieve a shift to high performance elements.

BRIEF DESCRIPTION OF THE DRAWINGS

FIG. 3 shows graphs showing the variation in mutual impedance characteristics of MOS transistors: (a) indicates a case in which conventional pure water is used in the cleaning procedure, while (b) indicates a case in which the pure water of the embodiments is used in the cleaning procedure.

(Description of the References)

1 filtering apparatus,
2 high pressure pump,
3 reverse osmosis unit,
4 transmitted water tank,
5, 8 pumps,
6-1, 6-2 ion-exchanging columns,
7 water storage tank,
9 sterilization mechanism,
10 ultrafiltration apparatus,
11 catalyst holding mechanism,
12 microwave generating mechanism,
13 use point,
14 catalyst holding vessel,
15 pure water input port,
16 pure water output port,
17 catalyst,
18 Teflon sheet filter,
19 resonator,
20 microwave waveguide.

BEST MODES FOR CARRYING OUT THE INVENTION

Hereinbelow, the present invention will be explained in detail based on embodiments; however, the present invention should not be construed as being in any way limited to the embodiments described.

(Embodiment 1)

Pd powder having a particle diameter of 1–2 μm and 50 ml of pure water were placed in a beaker, and this was irradiated with 100 W microwaves from a 2.45 GHz magnetron for a period of 1 hour. As a comparative example, test materials were prepared in which the Pd described above was merely added to the pure water, and in which the Pd was not added and only the above microwave irradiation was performed.

Silicon wafers from which oxide films had been removed by hydrofluoric acid were immersed in these test materials, and the wettability of the silicon with pure water was determined.

In the case of the test material in which only the above Pd was added to pure water, and in the case of the test material which was only subjected to the above microwave irradiation, as in the case of untreated pure water, no essential change was noted in the wettability of the silicon wafer; however, the pure water which was subjected to the treatment in accordance with the present embodiment wetted the entire wafer surface and thus exhibited great improvement in the wettability of the silicon.

(Embodiment 2)

Figure 1:
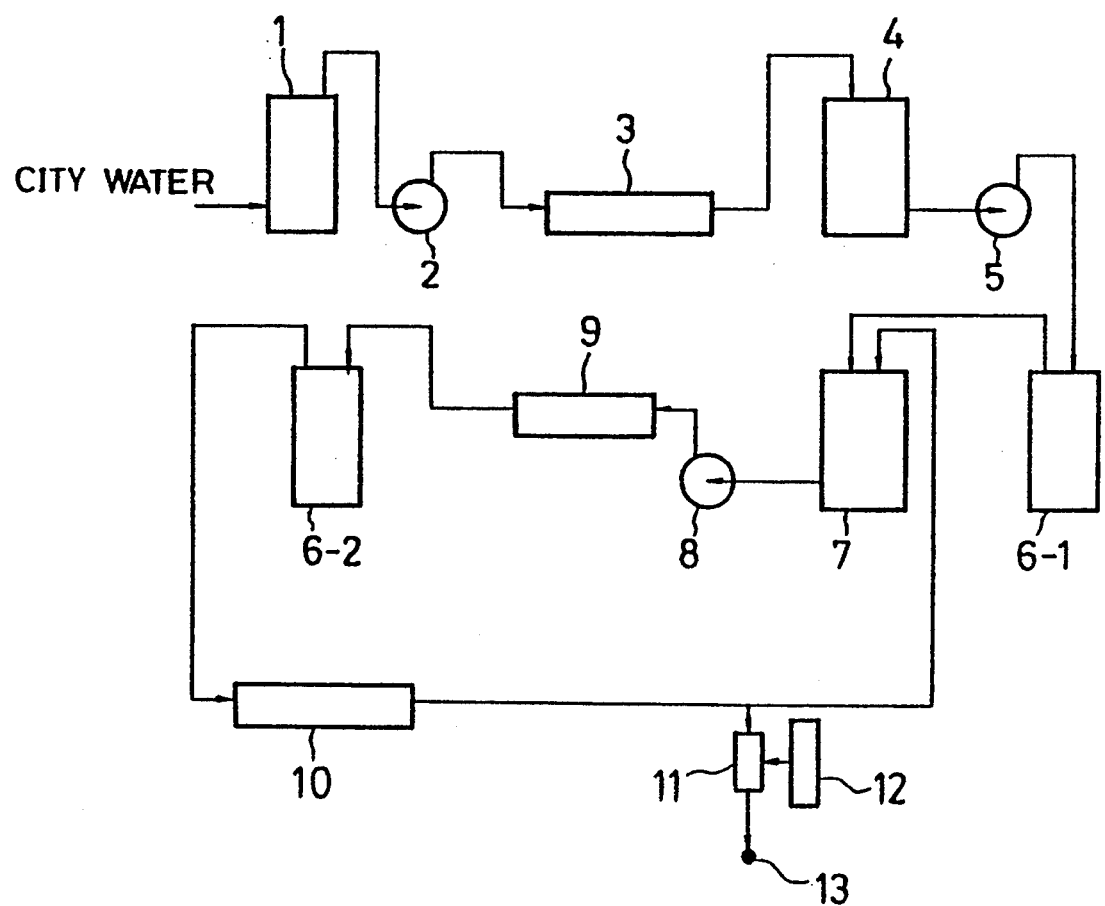
FIG. 1 is a concept diagram showing a structural example of a pure water production apparatus in accordance with the present invention.
Figure 2:
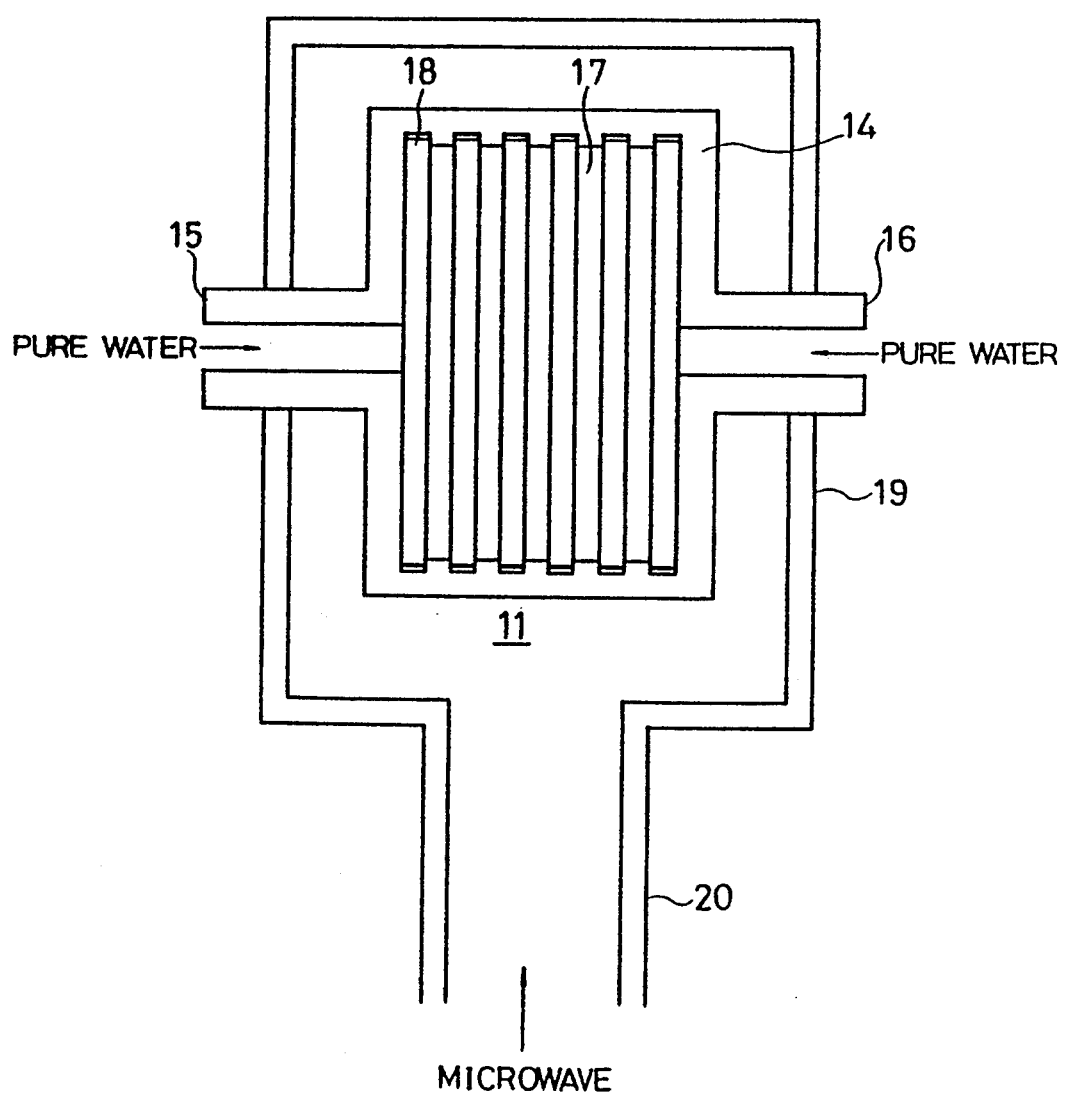
FIG. 2 is an outline diagram showing an example of a catalyst holding mechanism.

The Teflon catalyst holding mechanism 11 containing 5 catalyst layers having a width of 1 μm shown in FIG. 2 was provided between the pure water circulation system shown in FIG. 1 and use point 13. Here, a Teflon sheet filter 18 having a 2 μm hole system was employed, and Pd powder having a particle diameter of 5-6 μm was employed as the catalyst.

The holding mechanism 11 was placed in a resonator 19 of a magnetron-type microwave generator 12, and via a microwave wave guide 20, microwaves of 2.45 GHz and 700 W were applied to the catalyst. A pump was provided on the upstream side of holding mechanism 11, and the flow rate of the pure water was set at 2 L/min.

In order to demonstrate that the present invention is effective in improving the device characteristics, an MOS transistor production test was conducted. Using a channel length of 0.5 μm and a channel width of 1.5 μm, 3 types of transistors were created on the same chip; one having a contact hole between the source and the drain having dimensions of 1 μm×1 μm, one having a contact hole of 0.6 μm×0.6 μm, and one having a contact hole of 0.3 μm×0.3 μm.

Apart from the contact holes, all test production was conducted using 5:1 compact-type g-linesteppers. With respect to the contact holes, formation was conducted using g-linesteppers in the case of the 1 μm holes and the 0.6 μm holes; however, the formation of the 0.3 μm holes was conducted using EB direct writing.

The opening of the contacts was conducted by means of a reactive ion etching method using $CF_4$ and $H_2$ gasses. Subsequently, wafer cleaning was conducted by an RCA treatment, etching was conducted with dilute hydrofluoric acid, and then final cleaning was conducted using conventional pure water and two types of pure water in accordance with the present embodiment. Subsequently, Al was deposited by a bias sputtering method, and after patterning, an evaluation of the characteristics of each transistor was conducted, and the mutual impedance $g_m$ was evaluated.

In order to observe the effects of the remaining impurities of the contact portions with good sensitivity, the post-metallization alloying annealing (sintering) was not conducted.

The results of the evaluation are shown in FIG. 3. Evaluation was conducted with respect to a number of transistors numbering approximately in the 10 s to 100 under each set of conditions, and $g_m$ is shown as a value in which the actual measured value thereof is normalized by the average value $g_m^*$ of each universe.

In samples in which final cleaning was conducted using conventional pure water, in the case of the 1 μm×1 μm contact hole, the variation in $g_m$ was small; however, as the contact size grew smaller, with dimensions of 0.6 μm and 0.3 μm, the variation became great as $g_m/g_m^*$ decreased below a value of 1. This is so because as the contact holes become smaller, wettability worsens when conventional pure water is used, and since cleaning is insufficiently conducted, impurities remain in the bottom portions thereof, and the electrical contact between the metal and the silicon after metallization worsens.

However, in the case in which the pure water of the present preferred embodiment was used in the final cleaning, as shown in FIG. 3(b), even if the contact size became small, a reduction in $g_m$ was not exhibited. That is to say, this is because the impurities were sufficiently cleaned away by means of the pure water in accordance with the present embodiment. In the case in which the pure water of the present embodiment was used, a slight variation in characteristics independent of contact size was observed; however, this represents a variation in processing dimensions.

Industrial Applicability

In accordance with the present invention, the cleaning of silicon wafers becomes more complete, and very small amounts of impurities which could not be removed using conventional pure water can be removed, so that it becomes possible to produce high performance elements.

We claim:

1. A method for preparing pure water for use in cleaning a semiconductor body, said method comprising the step of applying microwaves to water while said water and a catalyst are brought into contact.

2. A pure water production method in accordance with claim 1, wherein the specific resistance of said water is 18 MΩ.cm or more.

3. A pure water production method in accordance with claim 1 wherein the frequency of said microwaves is within a range of 1–10 GHz.

4. An apparatus for preparing pure water for use in cleaning a semiconductor body, said apparatus comprising a catalyst holding means for holding a catalyst so as to be in contact with water introduced into the interior thereof, and a microwave generating means for applying microwaves to water introduced into said catalyst holding means, said catalyst holding means and microwave generating means disposed in an intermediate portion of a piping for delivering pure water to a use point.

5. A method for cleaning a semiconductor substrate body, said method including the step of cleaning a substrate body surface with pure water produced by the method in accordance with claim 1.

6. A method for cleaning a silicon wafer body with pure water, at least a portion of said silicon wafer body having an exposed silicon metal surface, said method including the step of applying microwaves to water while said water and a catalyst are brought into contact.

7. A pure water production method in accordance with claim 2, wherein the frequency of said microwaves is within a range of 1–10 GHz.

8. A method for cleaning a semiconductor substrate body said method including the step of cleaning a substrate body surface with pure water produced by the method in accordance with claim 2.

9. A method for cleaning a semiconductor substrate body said method including the step of cleaning a substrate body surface with pure water produced by the method in accordance with claim 3.

* * * * *